US010394290B2

(12) United States Patent
Hardin (10) Patent No.: US 10,394,290 B2
(45) Date of Patent: Aug. 27, 2019

(54) DATA CENTER GEOTHERMAL COOLING

(71) Applicant: James R. Hardin, Brownsburg, IN (US)

(72) Inventor: James R. Hardin, Brownsburg, IN (US)

(73) Assignee: G I Patents LLC, Indianapolis, IN (US)

( * ) Notice: Subject to any disclaimer, the term of this patent is extended or adjusted under 35 U.S.C. 154(b) by 23 days.

(21) Appl. No.: 15/481,906

(22) Filed: Apr. 7, 2017

(65) Prior Publication Data

US 2017/0293330 A1    Oct. 12, 2017

Related U.S. Application Data

(60) Provisional application No. 62/319,585, filed on Apr. 7, 2016.

(51) Int. Cl.

| | |
|---|---|
| *G06F 1/20* | (2006.01) |
| *F24T 10/00* | (2018.01) |
| *F03G 7/04* | (2006.01) |
| *H05K 7/20* | (2006.01) |
| *G06F 17/50* | (2006.01) |
| *F24T 10/10* | (2018.01) |
| *F28D 20/00* | (2006.01) |

(52) U.S. Cl.
CPC .................. *G06F 1/20* (2013.01); *F03G 7/04* (2013.01); *F24T 10/00* (2018.05); *G06F 17/50* (2013.01); *H05K 7/2079* (2013.01); *H05K 7/20836* (2013.01); *F24T 10/10* (2018.05); *F28D 20/0052* (2013.01); *G06F 2200/201* (2013.01); *Y02E 10/12* (2013.01)

(58) Field of Classification Search
CPC ...... G06F 1/20; G06F 17/50; G06F 2200/201; F24T 10/10; F03G 7/04; H05K 7/20836; H05K 7/2079; Y02E 10/10
USPC ........................ 60/641.2–641.4; 62/160, 260
See application file for complete search history.

(56) References Cited

U.S. PATENT DOCUMENTS

| | | | |
|---|---|---|---|
| 3,958,637 | A | 5/1976 | Cobbs |
| 3,986,362 | A * | 10/1976 | Baciu ...................... F01K 3/181 |
| | | | 60/641.2 |
| 4,625,797 | A | 12/1986 | Tsutsumi et al. |
| 4,714,108 | A | 12/1987 | Barry |
| 5,630,447 | A | 5/1997 | Jensen |
| 5,651,251 | A | 7/1997 | Hardin |
| 5,727,621 | A | 3/1998 | Hardin |
| 6,000,459 | A | 12/1999 | Jeppesen |

(Continued)

*Primary Examiner* — Hoang M Nguyen
(74) *Attorney, Agent, or Firm* — E. Victor Indiano; Indiano Law Group LLC (57) ABSTRACT

A geothermal system is disclosed for cooling a plurality of computer processing devices which includes a first heat exchanger in thermal communication with a plurality of computer processing devices, wherein the first heat exchanger includes a heat absorbing fluid structured to receive heat from the plurality of computer processing devices. The geothermal system further includes a chiller in selective flow communication with the first heat exchanger, wherein the chiller is structured to selectively receive at least a portion of the heat absorbing fluid. The geothermal system further includes a geothermal field structured to exchange heat in the heat absorbing fluid with a geological heat sink.

18 Claims, 6 Drawing Sheets

(56) References Cited

U.S. PATENT DOCUMENTS

| | | | |
|---|---|---|---|
| 6,035,949 A | | 3/2000 | Altschuler et al. |
| 6,454,010 B1 | | 9/2002 | Thomas et al. |
| 6,503,239 B1 | | 1/2003 | Bruemmer-Prestley et al. |
| 7,048,037 B2 | | 5/2006 | McNair et al. |
| 7,213,649 B2 | | 5/2007 | McNair et al. |
| 9,485,887 B1 | * | 11/2016 | Eichelberg ............ H05K 7/1497 |
| 2008/0289795 A1 | | 11/2008 | Hardin et al. |
| 2010/0154448 A1 | * | 6/2010 | Hay .......................... G06F 1/20 62/175 |
| 2011/0272117 A1 | * | 11/2011 | Hamstra ................. F24D 12/02 165/45 |
| 2015/0267941 A1 | * | 9/2015 | Kato ........................ F25B 6/02 62/175 |
| 2016/0141937 A1 | * | 5/2016 | Campbell ............... F25B 15/00 290/43 |
| 2016/0195314 A1 | * | 7/2016 | Sedlak .................... F25B 30/00 60/641.2 |

* cited by examiner

DATA CENTER GEOTHERMAL COOLING

CROSS REFERENCE TO RELATED APPLICATIONS

The present application claims the benefit of U.S. Provisional Application No. 62/319,585, filed on Apr. 7, 2016, the entire contents of which are hereby expressly incorporated by reference.

BACKGROUND

The present invention relates to geothermal cooling systems, and more particularly to a geothermal cooling system that has particular utility in connection with large heat generation sources such as information technology centers that include large numbers of processing devices.

Information technology centers for large organizations and heavy data processing companies usually contain a large array of electronic devices of various types, such as main frames, servers, routers, modems, personal computers and other chip containing devices. One byproduct of the use of such devices is the generation of significant amounts of heat.

In fact, a major engineering concern for all computer and information technology device designers is to find a way to appropriately dissipate the heat generated by computer equipment. For example, one viewing a computer's main processing chip will see that the chip includes a heat sink and small fan thereon to help dissipate the heat generated by the chip.

This problem of dissipating generated heat becomes magnified by several orders of magnitude when one is dealing with a multi-computer system, such as may exist at a large server farm or data processing operation used in connection with the operations of a large company, such as a large manufacturing company, or any company that generates or processes a large amount of data.

Dissipating this heat often requires a significant infrastructure investment in chillers, pipes, air conditioning systems and the like to provide cooled air or cooled water to cool the heat generation source. Additionally, this heat dissipation requires a large energy input. For example, it has been found by the Applicant that in certain applications, the energy required to operate a cooling system (e.g. air conditioner) to cool the information technology equipment may be greater than the electricity required to operate the information technology equipment itself. Therefore, further technological developments are desirable in this area.

SUMMARY

One embodiment of the present application includes a geothermal cooling system for a data center. Other embodiments include unique data center cooling apparatuses, systems, and methods. Further embodiments, inventions, forms, objects, features, advantages, aspects, and benefits of the present application are otherwise set forth or become apparent from the description and drawings included herein.

A geothermal chilling system comprises a geothermal field having a plurality of geothermal pipes through which a cooling liquid, such as water can flow to cool and heat the water through the transfer of geothermal energy between the pipe system and the adjacent ground.

An IT system may include a water-based cooling system that may include pipes for flowing the water through the system to cool room in which the heat generating devices are housed. Alternately, it may include a water pipe system that flows the water adjacent to heat sinks connected to the heat generating devices. Additionally, the system of the present invention may include a heat exchanger that takes chilled water, and passes air over it in a heat exchanger to thereby chill the air. The chilled air is then blown into the information technology center room.

The thermal cooling capacity of the thermal mass of a geothermal field can provide the cooling energy necessary to serve the IT or other production facility with much less energy and cost than conventional electrically driven chillers. As the geothermal mass absorbs thermal energy, the temperature of the geothermal field can rise to a point where it does not serve as effectively as a heat sink for cooling the water that is flowed through the geothermal cooling pipes.

The present invention addresses this problem with one or a combination of the following actions: (1) employing chillers to cool the water in the geothermal piping system during inexpensive off peak hours electrical operating periods and then flowing the cooled water through the geothermal field to cool it, so that it may regain its effectiveness as a heat sink during peak electrical operating periods; (2) employing air to water fluid coolers during cooler evening or seasonal periods to perform the same function as the method set forth above in clause (1); and (3) directing water to a parking lot deicing system, that transfers the heat within the geothermal water to parking lot and deicing system, so that the geothermal water is cooled before being passed through the geothermal field, to thereby help cool the field.

Basically, the geothermal field with its large thermal mass can be relied on to provide the cooling capacity necessary to keep the IT or other facility at a proper temperature if the geothermal field is maintained in the proper temperature range through use of previously described resources.

These and other features of the present invention will become apparent to those skilled in the art upon a review of the drawings and detailed description set forth below, that are believed to represent the best mode of practicing the invention perceived presently by the Applicant.

BRIEF DESCRIPTION OF THE DRAWINGS

The description herein makes reference to the accompanying drawings wherein like reference numerals refer to like parts throughout the several views, and wherein.

DETAILED DESCRIPTION

For purposes of promoting an understanding of the principles of the invention, reference will now be made to the embodiments illustrated in the drawings and specific language will be used to describe the same. It will nevertheless be understood that no limitation of the scope of the invention is thereby intended, any alterations and further modifications in the illustrated device, and any further applications of the principles of the invention as illustrated therein being contemplated as would normally occur to one skilled in the art to which the invention relates.

A schematic representation of the geothermal system of the present invention is best shown in FIGS. 2-5.

Figure 2:
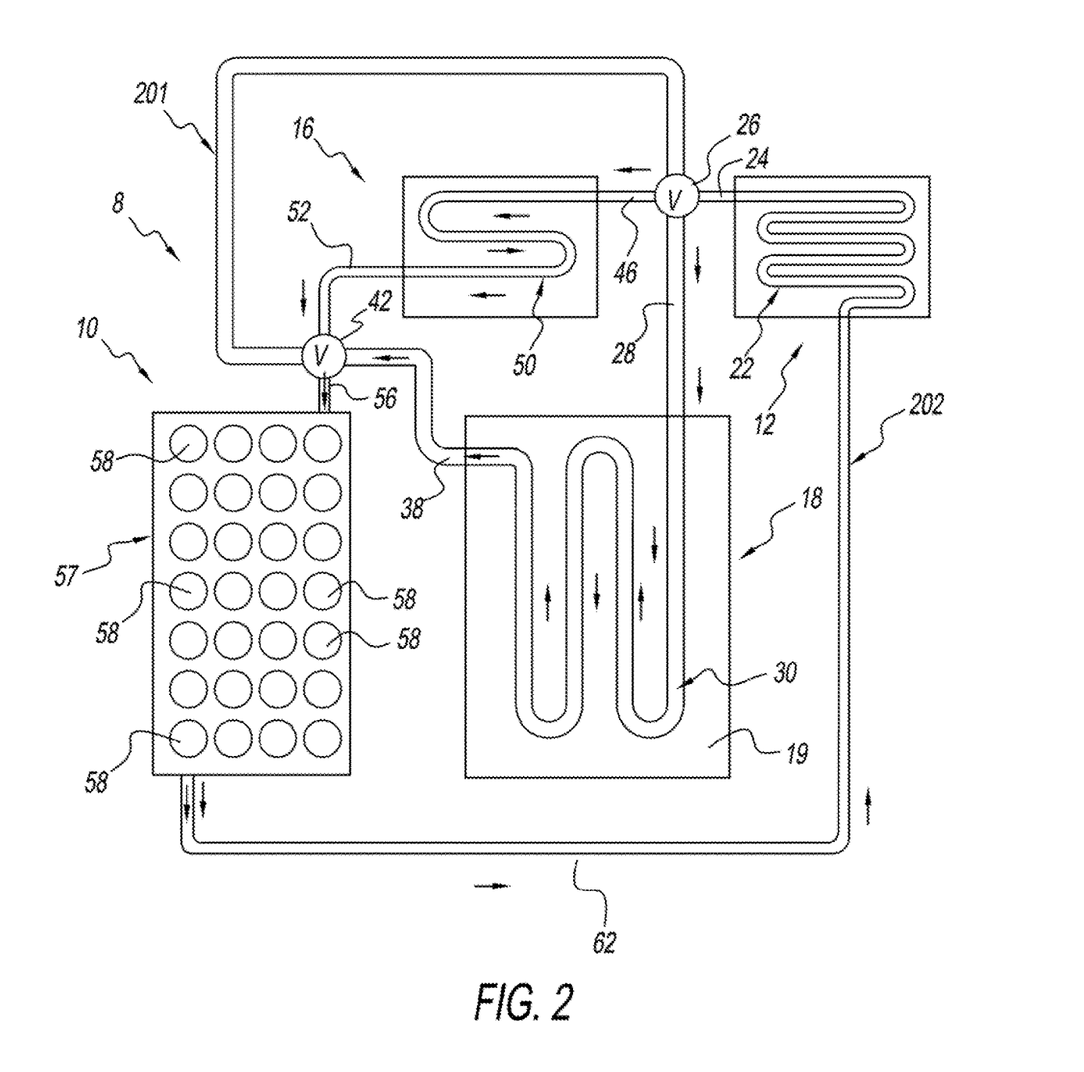
FIG. 2 is a highly schematic view of a geothermal system of the present invention.

The primary components of the geothermal system 8 include a geothermal field 10 that comprises a plurality of geothermal pipes, such as the Hardin Geothermal Heat Exchangers discussed in other patents invented by the Applicant, James R. Hardin. These other patents are referenced in this application elsewhere, and are fully incorporated by reference into this application.

Although geothermal fields can be of any shape and size, a hypothetical geothermal field for the present invention may consist of a plurality of pipes arrayed over a field having a length of about 600 feet, a width of about 600 feet and wherein the pipes were each bored into the earth to a depth of about 400 feet.

A heat generating facility 12 such as an IT facility exists that generates heat through the operation of electronic devices such as computer 66. Part of the cooling loop of the present invention extends through the heat generating facility, either directly or indirectly, so that the heat conducting fluid can absorb the heat generated by the IT facility to remove that heat, so that the heat can be transferred either into the geological field 10, the chiller 16, or the parking lot heat dissipater 18. The heat conducting fluid can be water with antifreeze or other conditioners. Various antifreezes are contemplated for use with the heat conducting fluid, including, but not limited to propylene glycol, ethylene glycol, various alcohols (e.g. methanol and ethanol), and calcium chloride.

The chiller heat exchanger 16 is provided for helping to dissipate the heat picked up by the coolant fluid after it passes through the heat generating facility 12. As utilized herein, the term chiller can include a variety of heat exchangers (e.g. water to air heat exchangers, water to water heat exchangers, evaporative coolers, and the like) as well as vapor-compression chillers, adsorption refrigeration chillers, cooling towers, as well as any other device one of ordinary skill in the art would identify as a chiller. An example of another heat exchanger chiller that might perform well is a Bernoulli tube heat exchanger of the type normally associated with large power plants.

The heat dissipater 18 is provided for helping to dissipate heat, especially during the winter. A fluid bypass 201 permits the coolant fluid to bypass the chiller 16 and the dissipater 18. The fluid bypass 201 allows the entire heat load from the heat generating facility 12 to be directed toward the geothermal field 10. As would be readily understood to one of ordinary skill in the art, this bypass can be accomplished via valves 26 and 42.

The heat generating facility 12 includes a heat exchanger 22. The heat exchanger 22 includes one or a series of pipes that may be run either in series or in parallel. The pipes are placed in a position wherein they are available for absorbing heat from the heated electronics as efficiently as possible.

For example, the IT devices may include heat sinks that are disposed within the coolant loop 22 so that water may pass over the cooling loop to thereby cool the heat sinks. As an IT system operates on electricity, it is important to segregate the water from the electricity to prevent shorting and shocks.

One or more pumps, illustrated at 202, act on the heat absorbing fluid and provide a motive force thereto. As will be understood to one of ordinary skill, the pumps may be integrated into the system at various locations and various pumps may be utilized depending on the specific application. In one form, pump 202 is a centrifugal circulating pump.

Heated water merges in pipe 24 from the heat exchanger loop 22 and passes into a valve 26. From the valve 26, the water can be directed either through pipe 46 to the chiller 16, or through pipe 28 into the heat dissipater 18.

Heat that flows through the chiller 16 flows through a loop 50 that may comprise a single looping pipe or alternately, can comprise a series of pipes that run in parallel.

Another exchange medium such as air or the like is run over the loop 50 to draw as much heat as possible out of the loop 50. As discussed elsewhere in this application, the chiller will operate rather efficiently in colder temperatures, but is not that efficient in warmer temperatures, as the heat of ambient air that runs past the cooler may not be that much colder than the heated water within loop 50.

During winter months, water may be directed to flow through the heat dissipater 18. The heat dissipater 18 can comprise a parking lot having a parking surface 19. A single loop of pipe, or a plurality of pipes running in parallel can be imbedded within the parking lot pavement or placed slightly under the pavement so that the heat from the water in the pipe loop 30 helps to heat the pavement that comprises the surface 19 of the parking lot.

During winter, the coldness of the parking lot paving material will tend to cool the water within the pipe 30. Additionally, the hot water in pipe 30 will tend to heat the pavement. By heating the pavement, one can help to prevent snow from accumulating on the pavement additionally, if snow does form, the hot water that runs through loop 30 can heat the snow or ice, to thereby deice or remove snow from the parking lot.

As mentioned elsewhere, this ability to deice a parking lot can save the parking lot owner a great deal of money both by reducing the need to plow and shovel the parking lot, and also by reducing the likelihood of slip and fall type injuries that might occur on an icy parking lot.

Water that has passed through the heat dissipater 18 will exit the heat dissipater 18 at a significantly lower temperature than it entered the heat dissipater 18.

An outflow pipe 88 is provided for conveying water away from the heat dissipater, and into a valve 42. Similarly, an outflow pipe 52 is provided for conducting water away from chiller 16. From the valve 42, water is then passed into an inflow pipe 56 that feeds water into the various individual geothermal pipes 58 that are contained within the geothermal field.

Figure 3:
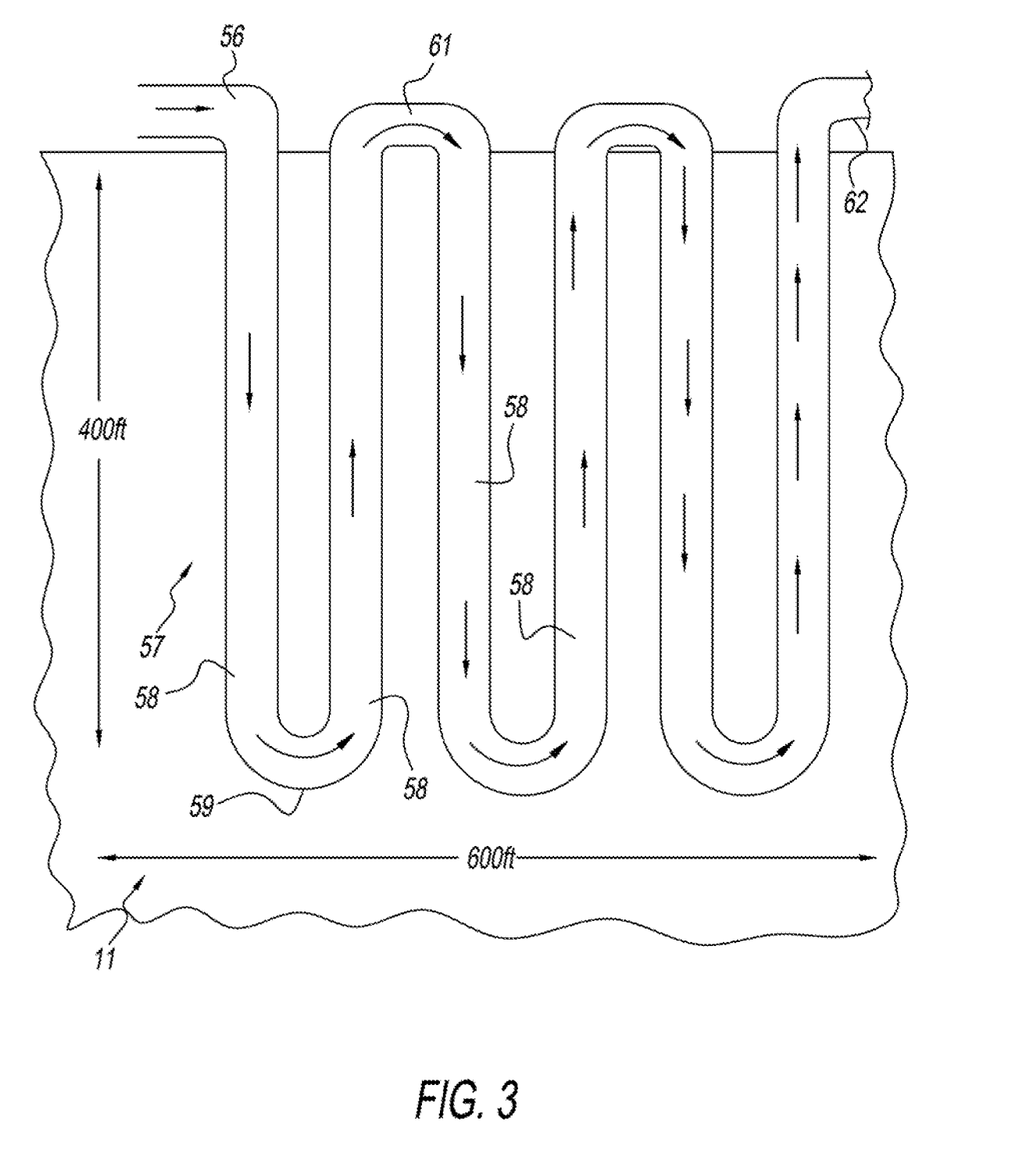
FIG. 3 is a highly schematic view of a geothermal heat exchanger component of the geothermal system of the present invention.

As shown in FIG. 3, the pipes 58 within the geothermal field can comprise pipes that form a single loop throughout the pipes, so that the water flows from the surface down to the bottom of one pipe, across a connector member 59 and then into another pipe wherein the water flows upwardly to the surface, and then through another connector 61, and then into an adjacent downwardly flowing pipe 58.

Although the pipes can be drilled to any depth desired, it has been found by the applicant that a 400 foot depth works well in certain applications and does comprise an exemplary depth.

Water that then emerges from the geothermal field is sent into an outflow/return pipe 62 where it is conducted back into the heat exchanger 22 contained within the heat generating facility, such as the IT center.

Figure 4:
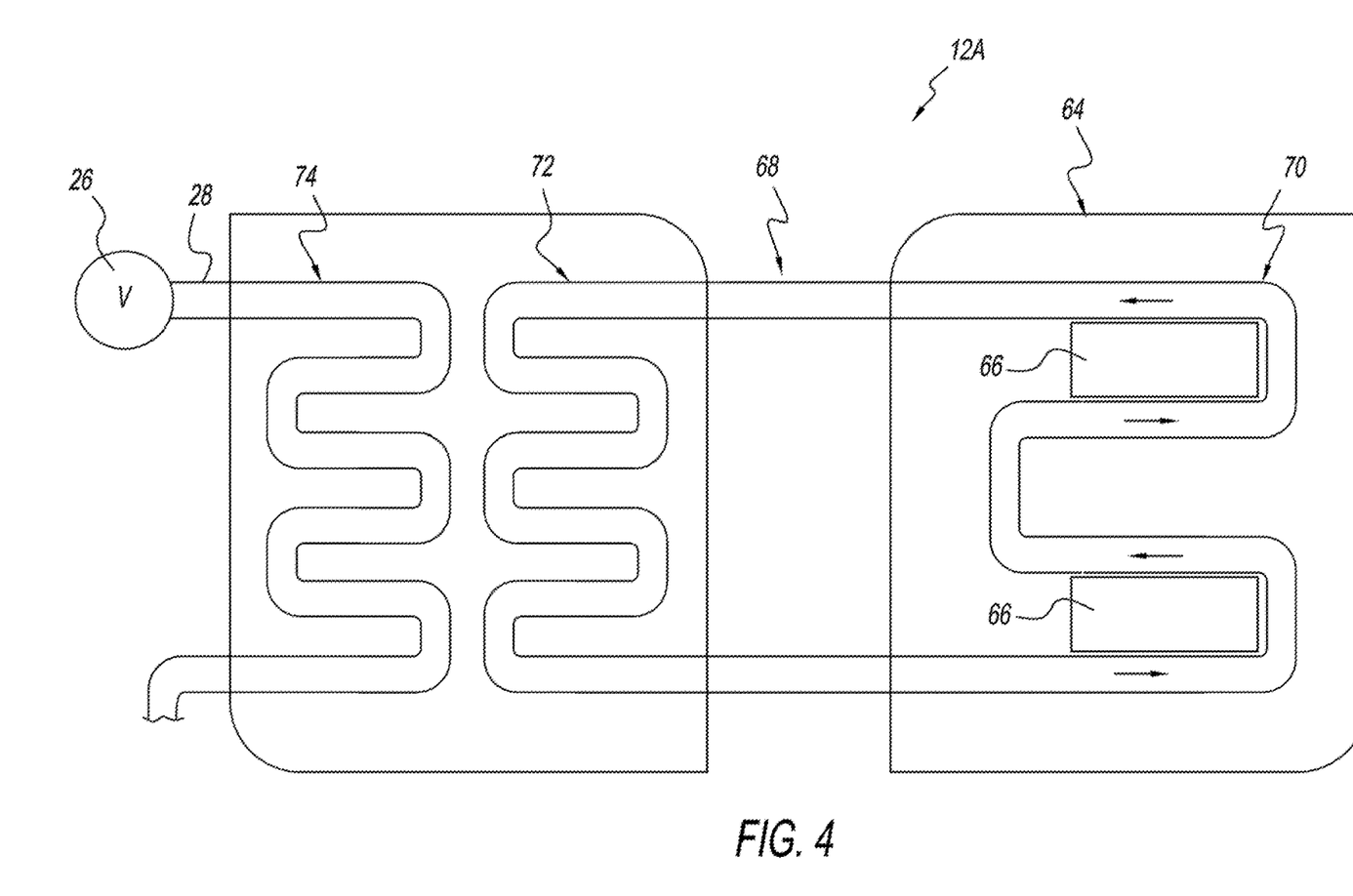
FIG. 4 is a highly schematic view of a heat exchanger system usable with an IT (information technology system) in conjunction with the geothermal system of the present invention.

FIG. 4 provides one example of a heat exchanger 12A that can be used in connection with an information technology center. The heat exchanger 12A comprises a dual loop, indirect heat exchanger. Heat exchanger 12A includes a first loop that includes a portion 70 that is placed adjacent to the heat generating members, such as computer 66 within the information technology field.

The loop 70 picks up the heat that is generated from the computers 66. The heated water is then passed into the secondary loop 72 that is in a heat exchange relation with a second loop 74. The water in loop 72 may be contained within a cabinet or heat exchanger, in a manner so that heat that is contained within the water in pipe 72 is transferred into loop 74. Loop 74 comprises a portion of the loop that conducts water between the chiller 16, geological field 10, and heat dissipater 18.

Figure 5:
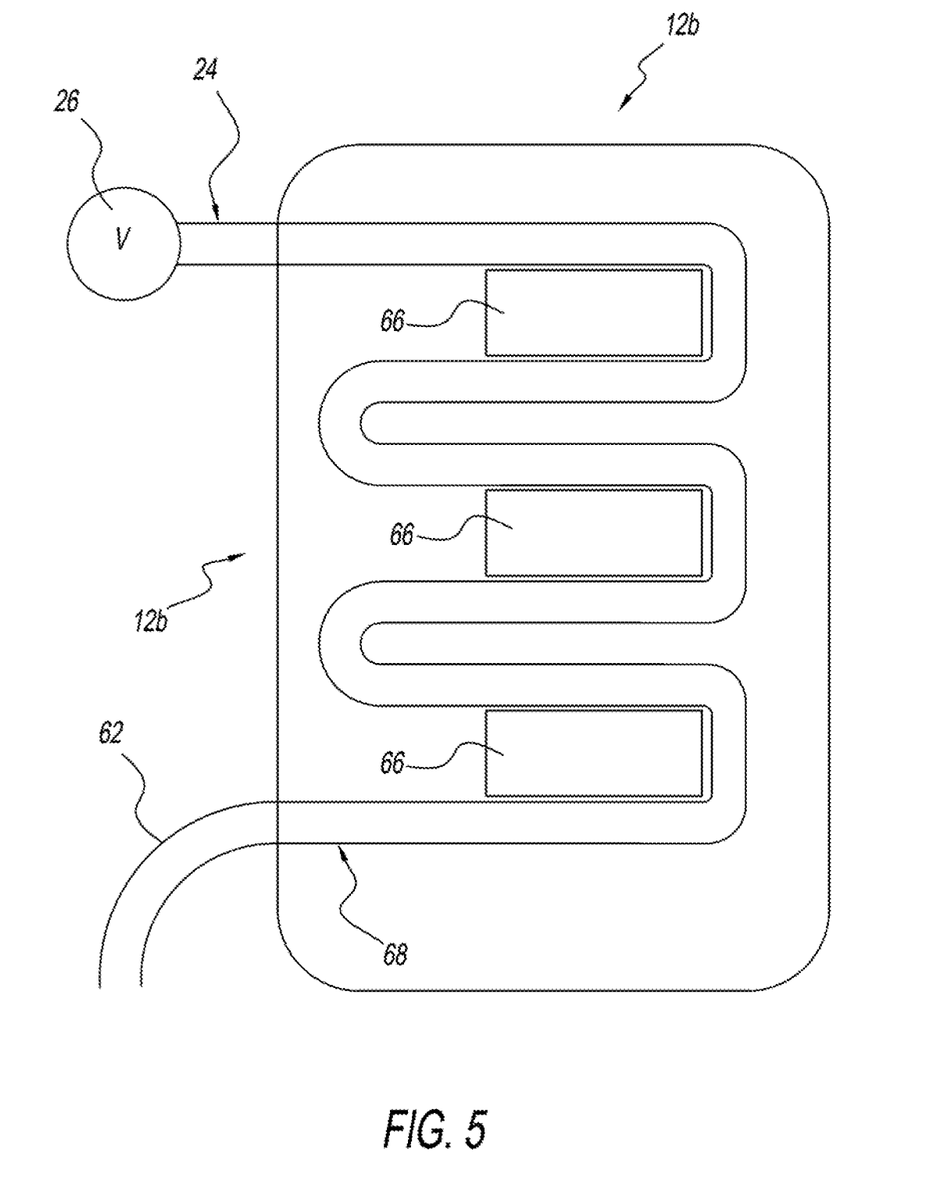
FIG. 5 is an alternate embodiment heat exchanger for an information technology system.

Another alternate embodiment heat exchanger is shown in FIG. 5. Heat exchanger 12B comprises a direct heat exchanger, wherein the loop 68 extends in a heat exchange relationship past the computer 66 and contains the same water (coolant fluid) that is ultimately flawed through valve 26 into the heat dissipater 18, chiller 16 and geothermal heat exchanger field 10. As such, FIG. 5 shows a direct heat exchange system where as FIG. 4 uses a more indirect heat exchange system.

The operation of the device is premised on the belief that a geothermal field, that for example, contains a rock formation, soil formation or the like, serves as a large and exploitable heat sink.

Typically, the soil and water within the field will have an ambient temperature that one might call ambient ground temperature or ground water temperature. This ambient ground temperature is often somewhat constant over a yearly period, but may increase or decrease from summer to winter. Importantly, rock formations and soil have a great capacity for holding heat and serving as a heat sink.

For example, a geothermal pipe containing field of a hypothetical size of 600 feet by 600 feet with a pipe depth of about 400 feet into a rock formation may have a heat potential of 40 million thousand mega BTUs of storable energy for a five degree rise or fall in Fahrenheit temperature. This is a huge thermal load.

During the summer, water from pipes that are disposed in this geothermal field, is run through a heat exchanger that draws heat from the IT system. At such time, the water picks up the heat generated by the IT system. The hot water that emerges from the IT system is then sent back through the geothermal pipes, so that the hot water in the pipes can be cooled by exchanging heat with the relatively cooler rock and soil of the field.

The heated water can be sent through a water to air type chiller. However, this is generally very inefficient during the summer because there is not much heat transfer capacity between the water and the air, because during the summer, the temperature of the ambient air might be at or around the temperature of the water.

As such, the water is sent into the geothermal system within the geothermal field. Over time, the continuous running of this hot water may raise the average temperature in the geothermal field. For example, the ground temperature may rise from 50 degrees to 55 degrees, or 65 degrees or 70 degrees, depending upon the location of the field, and the ambient ground temperature.

After running water through the geothermal system throughout the Summer, one creates a condition wherein you have used the geothermal potential energy stored within the field, to cool the information technology system by drawing on that stored coolness of the rock and soil, and transferring this coolness into the water, and then heating the water by running it through the IT system, and then putting this generated heat back in the field to thereby raise the ambient ground temperature.

This is essentially the functional equivalent of drawing water out of a large reservoir, running it through for example, a power plant, and then running it back into the reservoir. Over time, the reservoir will heat up as more and more water is run through the plant to heat up.

During the winter, the heat transfer process and heat storage reverse. Winter is used as a means for returning the geothermal field back to its lower temperature state by using the water running through it, along with cooler air temperatures.

This occurs by the water in the geothermal field being run through the IT system. When run through the IT system, the geothermal water will heat. However, this heated water can then be passed through a heat dissipation field, to thereby reduce the temperature. This heat dissipation field can comprise the use of the water to heat some area that thereby dissipates the heat.

For example, the relatively heated water can be run through a water to air chiller. During the winter, running the water through an air to water chiller is efficient because the cooler ambient temperature of the air will help to chill the water that emerges from the IT system.

A wide variety of chillers exist, including such things as evaporative air conditioners and the Bernoulli towers one might see at a power plant. Additionally, in northern climates such as Michigan, the mid-west and the northeast where snow and ice conditions exist, the heated water that emerges from the IT system can be flowed through a pipe system that may be positioned under a parking lot, and/or sidewalk or the like for the plant. Relatively hot water that flows through this system will tend to heat the sidewalk or parking lot. By heating the parking lot or sidewalk, snow that collects thereon is melted, and deiced. Additionally, the accumulation of snow is discouraged. Other creative uses of the heated water exist, such as flowing the water through buildings to serve as a supplemental heating system, or through greenhouses to keep the ambient temperatures at satisfactory levels.

Currently, some companies and hospitals spend a large amount of money to use a heating source to de-ice parking lots, because some have found it cheaper than using conventional deicing mechanisms, such as snow plows and salt. Additionally, if the parking lot is heated, ice will tend to melt, thus reducing instances of slip and fall injuries.

The present invention thereby provides a ready source of heated water to heat the parking lot. As a side benefit, the water that emerges from the parking lot heating system is relatively chilled when compared to the temperature of the water that emerges from the IT system.

Often, the water that is flowing in the heat exchangers under the parking lot will be substantially cooler than the geothermal water that emerges from the information technology system, and may be cooler than the ambient ground temperature in the geothermal field rock, soil and water formations. This relatively cooled water is then pumped back into the geothermal field. In such a case, the relatively cooled water then cools the soil and rock in geothermal field.

For example, if during the Summer the removal of water to cool the IT system, and the subsequent re-introduction of the water from the IT System into the geothermal field raises the temperature of the geothermal field ambient temperature by five degrees, the re-introduction in the Winter of the relatively colder water, and especially water that has been pre-chilled by being run through the parking lot heating system, may reduce the ambient temperature by five degrees to restore it to its original temperature. As will be appreciated, by reducing the temperature back to its original temperature, the efficiency of the heat exchange is increased and removal of heat from the heat exchanger during the subsequent cycle of the following summer, when the water is once again heated.

The Geothermal mass system of the present invention is believed to greatly reduce energy, water costs & environmental impact.

For larger data centers, cooling typically consists of large chiller systems coupled with cooling towers serving as heat sinks. Uninterruptible Power Supply (UPS) generators are required to insure no downtime in event of power outages. Amazingly, the cooling system typically requires higher energy consumption than the actual data system. Water consumption by cooling towers is a difficult issue to the point of limiting installations in some areas. There has been considerable effort over the years to mitigate capital, operational and environmental cost for this cooling system.

The applicant has developed geothermal technology products that have been shown to be efficient and reliable. Examples of such systems are shown in Hardin, U.S. Pat. Nos. 8,973,617; 5,727,621; 8,511,368; 6,053,239 and 5,651,251 (herein, the Hardin Heat Exchanger).

Figure 1:
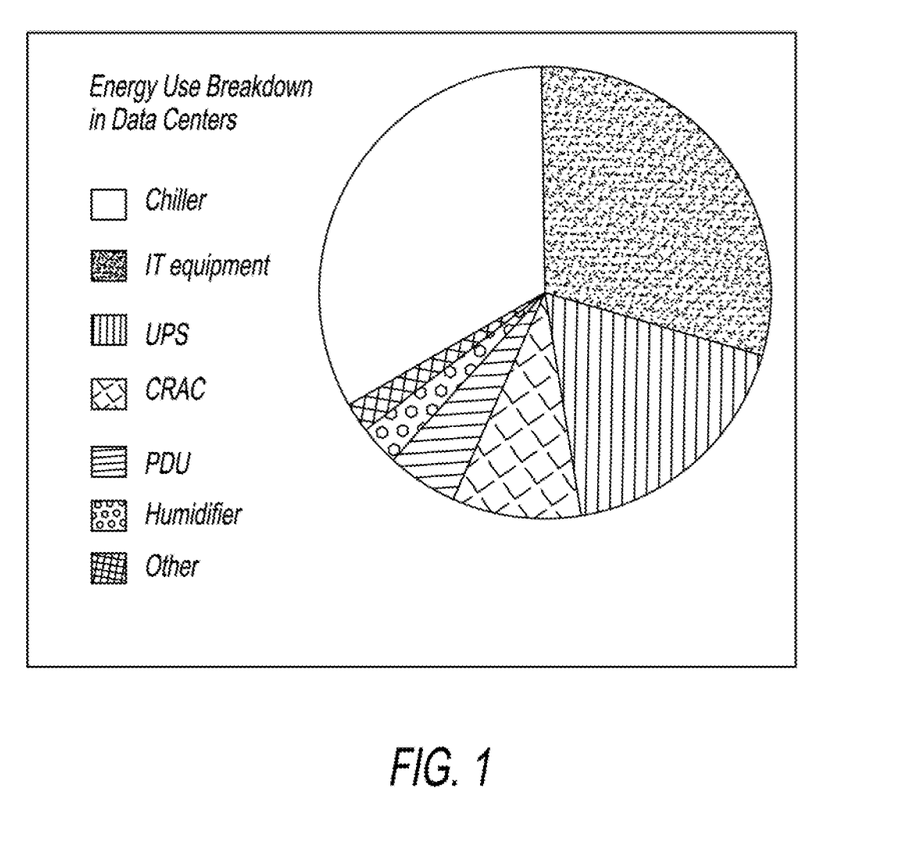
FIG. 1 is a chart showing heat usage of a typical information technology center.
Figure 1A:
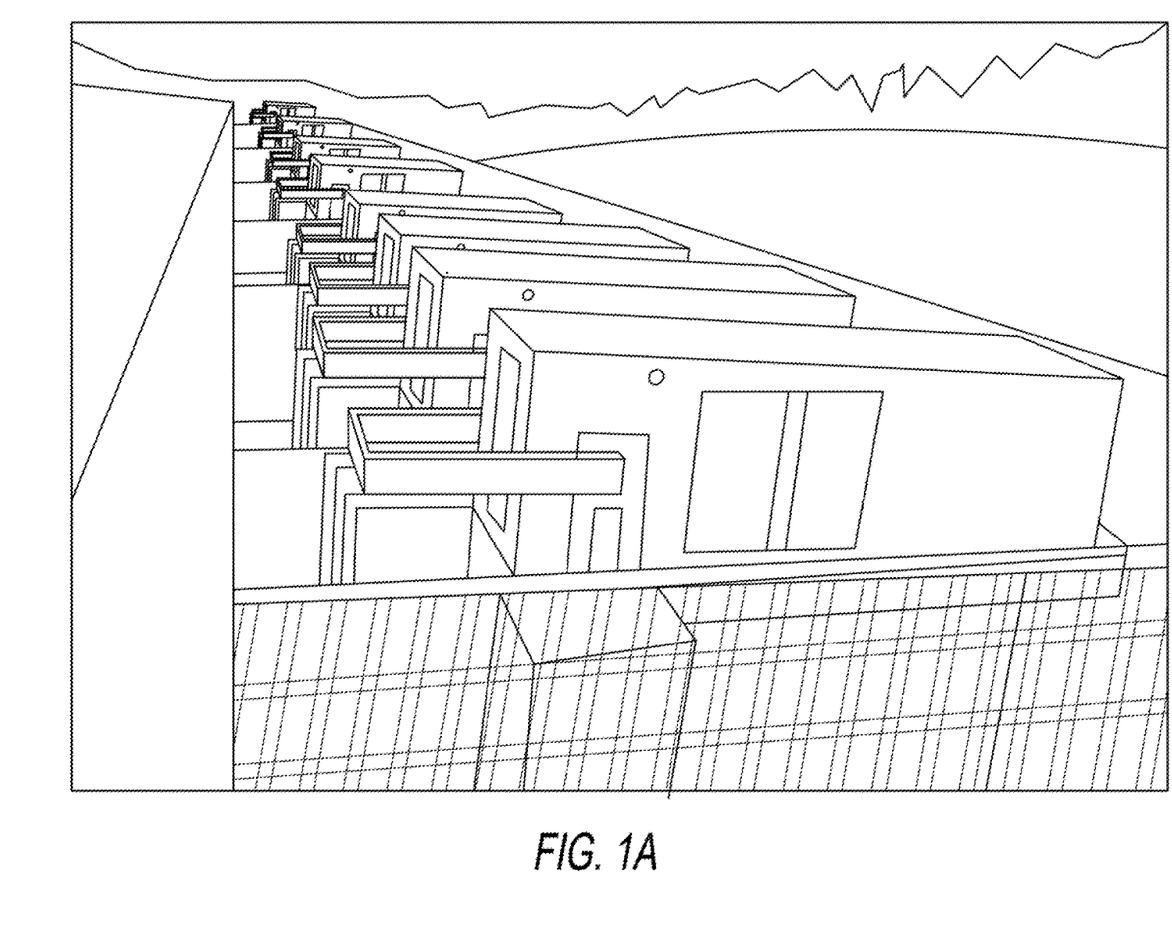
FIG. 1A is a photographic view of a Typical Chiller array at an Information Technology Facility

FIG. 1 shows just how significant cooling costs and environmental impact are for most data systems.

Using the Hardin present invention, capital equipment costs can be reduced through the following vehicles:
a. No (or fewer) chiller or fewer chillers exist that are operating off peak;
b. No (or fewer) cooling towers are necessary, along with their incident water/sewer use;
c. A smaller electric power infrastructure may be employed;
d. If green electricity is planned, operating costs can be reduced through the use of the present invention and the Hardin Heat Exchangers as it is believed that such a cooling system requires 75-90% less electric power to operate than some known conventional, prior art system;
e. Solar;
f. Wind;
g. Green power purchases;
h. the UPS generators required are nearly halved in size;
i. Maintenance costs may be much lower simply due to avoided equipment issues;
j. System reliability is likely higher for the same reason;
k. The equipment of the present invention is compatible with existing air or liquid cooling systems; and
l. Infrastructure and utility use is greatly reduced.

The cost savings impact of the use of the most recently developed Hardin exchanger is believed to be accurately represented by Table 1 set forth below:

TABLE 1

Materials and Labor Comparison (Estimate) for a Hypothetical 10 Ton Cooling Capacity Configuration (4000 sq. ft. .building) excluding costs of lateral pipe and the pump(s)

| Pipe Type | Side-By-Side | Concentric | Multi-Chambered |
| --- | --- | --- | --- |
| Pipe Diameter/ Description | Two, one inch diameter pipes placed side by side, PE HDPE80 | one, 3 inch diameter pipe placed inside one 3 inch diameter pipe, PE | one, 3-chambered pipe. High density polyethylene (BMHOPE e.g. PE-100) |
| Wall Thickness of outer wall | ⅛ inches | ⅜ inches | 0.167 inches |
| Thermal Efficiency | 2 tons/300 ft. | 2.5 tons/300 ft. | 4 tons/300 ft. |
| Cooling Capacity Desired | 10 tons | 10 tons | 10 tons |
| Cost of Pipe per "bored foot" | $1.30/ft. | $2.60/ft. | $3.50/ft. |
| Size of Bore hole Required | 6 inch | 4 inch | 4 inch |
| Cost of Boring per Foot | $8.00 | $8.00 | $6.50 |
| Cost of Installation per foot | $0.40 | $0.40 | $0.40 |
| Total No of Feet of Boring required | 1500 ft. | 1200 ft. | 800 ft. |
| Boring configuration (x bores each Y ft. in length) | 5 - 300 ft. bores | 4 - 300 ft. bores | 2 - 300 ft. bores 1 - 200 ft. bore |
| Total Est. Boring Costs | $12,000.00 | $9,600.00 | $5,200.00 |
| Total pipe costs | $1,475.00 | $2,520.00 | $2,800.00 |
| Total installation costs | $600.00 | $480.00 | $320.00 |
| Total Inclusive Costs of System | $14,075.00 | $10,200.00 | $8,320.00 |

In summary, it is believed that the present invention provides an opportunity for lower costs for capital investment and for operation. The present invention is scalable allowing installation for smaller segments and expanding over time. The installation's life expectancy will likely exceed 100 years for all major components.

Because of lower electrical uses, the environmental, CO2 emissions can be reduced significantly. Electrical power, water and waste water treatment are reduced as follows:

Water and waste water are eliminated, or at least reduced significantly.

The present system has the potential to reduce electric power consumption significantly for the cooling system. UPS power production is reduced by a similar amount.

The significantly lower water usage of the present invention can provide significant water availability benefits.

The present invention makes it relatively easy to harvest and effectively use waste heat. Consider parking lot and sidewalk ice melt, building heating, pool or spa and hot water production are options. Waste heat becomes an economic asset.

It is now possible to move the high levels of thermal energy required to support heavy data center requirements. The ground, to a depth of 400-600 feet, offers a large heat sink for rejection of data center heat. Alternately, recovery of the heat sink can now be accomplished during cold weather periods using the same heat exchangers coupled with surface equipment such as parking lot ice melt or ambient air to water heat exchangers.

The water circuit is closed so very little water is consumed geologic formation (heat sink) temperatures can now be engineered to maintain required temperature for support of data center requirements.

In practice a much smaller chiller system might be put in place, operating off peak when electric rates are minimal or when renewable resources are available. The geothermal field can then be smaller and perhaps even more economical to install.

The Hardin Heat Exchanger allows the needed large transfer of thermal energy to and from the water flowing through the pipes for any facility.

In various embodiments of the present invention, it is contemplated that power is only provided to operate the chiller when the current price of electricity falls below a predetermined threshold. This predetermined threshold could be triggered by a fixed dollar value, a day/night rate change, and/or any other value as would be understood by one of ordinary skill. When the current price of electricity falls below this predetermined threshold, power is supplied to the chiller and head absorbing fluid is passed therethrough cooling the fluid.

The heat dissipater may be utilized in response to the ambient temperature falling below a preset threshold. As will be understood to one of ordinary skill, this threshold can be a fixed external ambient temperature value (e.g. 55° F.), can be a temperature value dependent on whether ice or snow may accumulate on the parking lot or sidewalk into which the heat dissipater can be incorporated (e.g. 32° F.), or any other present threshold temperature value which may be desirable for a given application.

As was previously discussed, the chiller and/or the heat dissipater can be utilized to remove heat from the geological heat sink. This will "recharge" the geological heat sink and permit additional heat to be stored therein. A temperature of the geological heat sink can be determined in a variety of ways (e.g. direct measurement, calculation based on heat absorbing fluid exit temperature, or any other method of temperature calculation of the geological heat sink).

In one form, when the temperature of the geological heat sink exceeds a geological heat sink threshold value, one of the chiller and/or the heat dissipater are utilized to remove heat therefrom. As would be readily understood to one of ordinary skill, the geological heat sink threshold value will vary depending upon the depth of the geological heat sink, the initial (pre-installation temperature) of the geological heat sink, the maximum cooling fluid temperature which can leave the geological heat sink and still provide the desired cooling capacity to the computing devices, and the overall desired parameters of the particular application.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law.

Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. An apparatus, comprising:
    a first heat exchanger in thermal communication with a, heat generation source wherein the first heat exchanger includes a heat absorbing fluid structured to receive heat from the heat generation source;
    a second heat exchanger comprising a geothermal field structured to exchange heat from the heat absorbing fluid with a geological heat sink;
    a chiller disposed downstream of the first heat exchanger, wherein the chiller is structured to selectively receive a portion of heat absorbing fluid; and
    a heat dissipater disposed in parallel with respect to the chiller, wherein one or more valves are located downstream of the first heat exchanger to selectively flow at least a portion of heat absorbing fluid through at least one of the chiller and the heat dissipater; and
    wherein the heat dissipater is integrally formed with one of a parking lot and a sidewalk, and the heat dissipater is structured to pass heat from the heat absorbing fluid to the one of a parking lot and a sidewalk.

2. The apparatus of claim 1, wherein the heat generation source comprises a plurality of computing devices that further comprise a plurality of processors, wherein each of the plurality of processors further includes a heat sink, and wherein the heat sink is placed in direct communication with the heat absorbing fluid.

3. The apparatus of claim 1, further comprising a third heat exchanger structured to transfer heat from the heat absorbing fluid, absorbed from the first heat exchanger, to a second heat absorbing fluid which passes through the second heat exchanger, wherein the first heat exchanger and the second heat exchanger define a dual loop indirect heat exchanger.

4. An apparatus, comprising:
a first heat exchanger in thermal communication with a plurality of computing devices, wherein the first heat exchanger includes a heat absorbing fluid structured to receive heat from the plurality of computing devices;
a second heat exchanger comprising a geothermal field structured to exchange heat from the heat absorbing fluid with a geological heat sink;
a chiller disposed downstream of the first heat exchanger,
a heat dissipater disposed in parallel with respect to the chiller, wherein the chiller is structured to selectively receive a portion of heat absorbing fluid and one or more valves are located downstream of the first heat exchanger to selectively flow at least a portion of heat absorbing fluid through at least one of the chiller and the heat dissipater, and wherein the heat dissipater is integrally formed with one of a parking lot and a sidewalk, wherein the heat dissipater is structured to pass heat from the heat absorbing fluid to the one of a parking lot and a sidewalk.

5. The apparatus of claim 1, further comprising a fluid bypass disposed parallel the chiller and the heat dissipater.

6. The apparatus of claim 1, wherein heat from the geological heat sink is transferred to the heat absorbing fluid, and wherein this heat is dissipated by at least one of the chiller and the heat dissipater.

7. A geothermal system for cooling a heat generation source, comprising:
a first heat exchanger in thermal communication with the heat generation source, wherein the first heat exchanger includes a heat absorbing fluid structured to receive heat from the heat generation source;
a chiller in selective flow communication with the first heat exchanger, wherein the chiller is structured to selectively receive at least a portion of the heat absorbing fluid;
a second heat exchanger comprising a geothermal field structured to exchange heat in the heat absorbing fluid with a geological heat sink;
a heat dissipater disposed in parallel with respect to the chiller, configured for allowing a selective flow of at least a portion of heat absorbing fluid through at least one of the chiller and the heat dissipater; and
wherein the heat dissipater is integrally formed with one of a parking lot and a sidewalk, and the heat dissipater is structured to pass heat from the heat absorbing fluid to the one of a parking lot and a sidewalk.

8. The geothermal system of claim 7, wherein the chiller is one of a vapor-compression chiller or an absorption refrigeration cycle chiller.

9. A geothermal system for cooling a plurality of computer processing devices, comprising:
a first heat exchanger in thermal communication with a plurality of computer processing devices, wherein the first heat exchanger includes a heat absorbing fluid structured to receive heat from the plurality of computer processing devices,
a chiller in selective flow communication with the first heat exchanger, the chiller being structured to selectively receive at least a portion of the heat absorbing fluid;
a second heat exchanger comprising a geothermal field structured to exchange heat in the heat absorbing fluid with a geological heat sink
heat dissipater disposed in parallel fluid communication relative the chiller, the chiller and the heat dissipater being located downstream of the first heat exchanger and upstream of the second heat exchanger, wherein the heat dissipater is placed in thermal communication with one of a parking lot and a sidewalk, wherein the heat dissipater is structured to pass heat from the heat absorbing fluid to the one of a parking lot and a sidewalk.

10. The geothermal system of claim 7, further comprising a fluid bypass structured to permit the heat absorbing fluid to selectively bypass the chiller and the heat dissipater.

11. The geothermal system of claim 7, wherein heat is selectively absorbed by the heat absorbing fluid from the geological heat sink, and wherein the heat from the geological heat sink is dissipated by at least one of the chiller and the heat dissipater.

12. The geothermal system of claim 7, further comprising a third heat exchanger structured to transfer heat from the heat absorbing fluid, absorbed from the first heat exchanger, to a second heat absorbing fluid which passes through the second heat exchanger, wherein the first heat exchanger and the second heat exchanger define a dual loop indirect heat exchanger.

13. The geothermal system of claim 8, wherein the heat absorbing fluid comprises water and an antifreeze, and wherein at least one circulating pump provides a motive force to the heat absorbing fluid.

14. A method of cooling a heat generation source, comprising:
providing a first heat exchanger in thermal communication with a heat generation source, a second heat exchanger comprising a geothermal field in fluid communication with the first heat exchanger, and a chiller in selective fluid communication with the first heat exchanger and the second heat exchanger;
flowing a heat absorbing fluid through the first heat exchanger in a manner such that the heat absorbing fluid absorbs heat from the plurality of computer processing devices;
selectively flowing a portion of heated heat absorbing fluid from the first heat exchanger through the chiller such in a manner such that the chiller removes at least a portion of the heat from the heat absorbing fluid; and
passing the heat absorbing fluid through the second heat exchanger such that at least a portion of the heat absorbed by the heat absorbing fluid is dissipated into the geothermal field
providing a heat dissipater disposed in parallel with respect to the chiller and integrally formed with one of a parking lot and a sidewalk, and
selectively flowing at least a portion of heat absorbing fluid through at least one of the chiller and the heat dissipater to pass heat from the heat absorbing fluid to the one of a parking lot and a sidewalk.

15. A method of cooling a plurality of computer processing devices comprising:
providing a first heat exchanger in thermal communication with a plurality of computer processing devices, a second heat exchanger comprising a geothermal field in fluid communication with the first heat exchanger, and a chiller in selective fluid communication with the first heat exchanger and the second heat exchanger;

flowing a heat absorbing fluid through the first heat exchanger in a manner such that the heat absorbing fluid absorbs heat from the plurality of computer processing devices;

selectively flowing a portion, of heated heat absorbing fluid from the first heat exchanger through the chiller such in a manner such that the chiller removes at least a portion of the heat from the heat absorbing fluid; and passing the heat absorbing fluid through the second heat exchanger such that at least a portion of the heat absorbed by the heat absorbing fluid is dissipated into the geothermal field wherein selectively flowing a portion of heated heat absorbing fluid from the first heat exchanger through the chiller further comprises:

determining a current electric rate;

in response to the current electric rate falling below a predetermined threshold rate, flowing the heated heat absorbing fluid from the first heat exchanger through the chiller and providing power to the chiller to remove heat from the heat absorbing fluid; and in response to the current electric rate exceeding the predetermined threshold rate, flowing the heated heat absorbing fluid from the first heat exchanger to the second heat exchanger such that the second heat exchanger dissipates heat from the heat absorbing fluid, and wherein no power is provided to the chiller.

16. The method of cooling a plurality of computer processing devices of claim 14, further comprising:

providing a heat dissipater disposed in parallel fluid communication relative the chiller, wherein the chiller and the heat dissipater are located downstream of the first heat exchanger and upstream of the second heat exchanger;

determining an ambient temperature; and in response to the ambient temperature falling below an ambient temperature threshold value, flowing heated heat absorbing fluid from the first heat exchanger through the heat dissipater such that the heat dissipater dissipates a portion of the heat from the heat absorbing fluid.

17. The method of cooling a plurality of computer processing devices of claim 16, wherein the heat dissipater dissipating a portion of the heat from the heat absorbing fluid further comprises heating at least one of a parking lot and a sidewalk.

18. The method of cooling a plurality of computer processing devices of claim 16, further comprising:

determining a temperature of a geological heat sink surrounding the second heat exchanger; and in response to the temperature of the geological heat sink exceeding a predetermined geological heat sink threshold value, flowing the heat absorbing fluid to the geological heat sink such that heat from the geological heat sink is absorbed by the heat absorbing fluid, and flowing the heated heat absorbing fluid to at least one of the heat dissipater and the chiller such that the at least one of the heat dissipater and the chiller remove at least a portion of heat from the heat absorbing fluid.

* * * * *